(12) United States Patent
Asrani et al.

(10) Patent No.: US 9,629,267 B2
(45) Date of Patent: Apr. 18, 2017

(54) METAL MOSAIC HOUSING

(71) Applicant: Google Technology Holdings LLC, Mountain View, CA (US)

(72) Inventors: Vijay L Asrani, Round Lake, IL (US); Paul L Fordham, Wauconda, IL (US); Mark D Janninck, Glen Ellyn, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 0 days.

(21) Appl. No.: 14/283,620

(22) Filed: May 21, 2014

(65) Prior Publication Data

US 2015/0189767 A1  Jul. 2, 2015

Related U.S. Application Data

(60) Provisional application No. 61/921,932, filed on Dec. 30, 2013.

(51) Int. Cl.
| | |
|---|---|
| *H05K 5/00* | (2006.01) |
| *H05K 5/02* | (2006.01) |
| *H04M 1/02* | (2006.01) |
| *B32B 15/08* | (2006.01) |
| *B32B 15/20* | (2006.01) |
| *B32B 27/36* | (2006.01) |
| *B32B 3/12* | (2006.01) |
| *B32B 3/30* | (2006.01) |

(52) U.S. Cl.
CPC ............. *H05K 5/0243* (2013.01); *B32B 3/12* (2013.01); *B32B 3/30* (2013.01); *B32B 15/08* (2013.01); *B32B 15/20* (2013.01); *B32B 27/365* (2013.01); *H04M 1/0283* (2013.01); *B32B 2255/10* (2013.01); *B32B 2307/206* (2013.01); *B32B 2439/00* (2013.01); *B32B 2457/00* (2013.01); *Y10T 29/49204* (2015.01); *Y10T 29/49995* (2015.01)

(58) Field of Classification Search
USPC ............... 257/669; 312/223.1; 29/557, 874
IPC ....... B32B 15/08,15/20, 27/365, 3/12, 2255/10, 2307/206, 2439/00, 2457/00; H05K 5/0243; H04M 1/0283; Y10T 29/49204, 29/49995
See application file for complete search history.

(56) References Cited

U.S. PATENT DOCUMENTS

| | | |
|---|---|---|
| 2,747,166 A | 5/1956 | Hoffarth |
| 5,107,404 A | 4/1992 | Tam |
| 5,519,169 A | 5/1996 | Garrett et al. |

(Continued)

OTHER PUBLICATIONS

"Non-Final Office Action", U.S. Appl. No. 14/322,263, Mar. 24, 2016, 9 pages.

(Continued)

*Primary Examiner* — Hrayr A Sayadian
(74) *Attorney, Agent, or Firm* — Wolfe-SBMC (57) ABSTRACT

A housing for an electronic device and a method for manufacturing the housing are provided that combine metal and plastic in an aesthetically pleasing manner while meeting physical and technical requirements and specifications for the electronic device. Metal islands may be engaged with a plastic member so that projections of the plastic member are interlocked with corresponding recesses of formed between each of the metal islands. An exterior of the housing includes a surface of each of the metal islands and at least a portion of a surface of the plastic member. The interior of the housing includes another surface of the plastic member.

20 Claims, 6 Drawing Sheets

(56) References Cited

U.S. PATENT DOCUMENTS

| | | |
|---|---|---|
| 5,620,290 A | 4/1997 | Homfeldt et al. |
| 6,019,614 A | 2/2000 | Baur et al. |
| 6,560,119 B1 | 5/2003 | Katsuyama et al. |
| 7,349,222 B2 | 3/2008 | Kim |
| 7,456,793 B2 | 11/2008 | Napoles et al. |
| 7,491,070 B2 | 2/2009 | Chen et al. |
| 7,558,054 B1 | 7/2009 | Prest et al. |
| 7,633,747 B2 | 12/2009 | Yang et al. |
| 7,688,574 B2 | 3/2010 | Zadesky et al. |
| 8,000,111 B2 | 8/2011 | Liao |
| 8,199,528 B2 | 6/2012 | Tachikawa et al. |
| 8,238,087 B2 | 8/2012 | McClure et al. |
| 8,250,724 B2 | 8/2012 | Dabov et al. |
| 8,315,062 B2 | 11/2012 | Liu |
| 8,540,919 B2 | 9/2013 | Lin |
| 8,611,077 B2 | 12/2013 | Sanford et al. |
| 8,634,206 B2 | 1/2014 | Lin et al. |
| 8,797,721 B2 | 8/2014 | Pakula et al. |
| 9,507,380 B2 | 11/2016 | McKittrick |
| 2005/0079748 A1 | 4/2005 | Kim |
| 2006/0089023 A1 | 4/2006 | Kim |
| 2006/0202912 A1 | 9/2006 | Shin |
| 2010/0203929 A1 | 8/2010 | Skagmo et al. |
| 2012/0168578 A1 | 7/2012 | Peng et al. |
| 2013/0343015 A1 | 12/2013 | Malek et al. |
| 2016/0006845 A1 | 1/2016 | McKittrick |
| 2016/0007495 A1 | 1/2016 | McKittrick |

OTHER PUBLICATIONS

"Non-Final Office Action", U.S. Appl. No. 14/322,295, May 26, 2016, 8 pages.

"Notice of Allowance", U.S. Appl. No. 14/322,263, Jul. 29, 2016, 8 pages.

"Final Office Action", U.S. Appl. No. 14/322,295, Oct. 14, 2016, 13 pages.

"Corrected Notice of Allowance", U.S. Appl. No. 14/322,263, Nov. 4, 2016, 2 pages.

FIG. 15

METAL MOSAIC HOUSING

CROSS-REFERENCE TO RELATED APPLICATION

This application claims priority to U.S. Provisional Application No. 61/921,932, filed Dec. 30, 2013, which is incorporated herein by reference in its entirety.

FIELD

This application generally relates to a metal mosaic housing for an electronic device. In particular, this application relates to a housing for an electronic device including metal islands engaged with a plastic member such that projections of the plastic member interlock with corresponding recesses formed between each of the metal islands, and a method for manufacturing the housing.

BACKGROUND

Electronic devices, such as smartphones, tablets, and mobile devices, have become ubiquitous. Users may be more conscious of the appearance of their electronic devices because the electronic devices are typically seen by others while being used. For example, a user may hold an electronic device to their ear when talking or view the electronic device in their hand when using other features (e.g., email, web browsing, etc.). As such, the housings of electronic devices may be composed of multiple types of materials, such as metal and plastic, in different ways so that the appearances of the electronic devices can be made as desired.

It may be difficult to combine metal and plastic together in a unitary housing in an aesthetically pleasing manner, while ensuring that the housing is reliably and consistently manufactured and also providing adequate structural integrity for the electronic device. In addition, the physical requirements and specifications of a particular electronic device, e.g., size, weight, etc., may influence how the metal and plastic are combined together in a housing. The technical requirements and specifications for a particular electronic device, e.g., antenna, battery, processor, memory, display, etc., may also affect how the metal and plastic are combined.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed embodiments, and explain various principles and advantages of those embodiments.

DETAILED DESCRIPTION

A housing for an electronic device and a method for manufacturing the housing are provided that combine metal and plastic in an aesthetically pleasing manner while meeting physical and technical requirements and specifications for the electronic device. According to one embodiment, the housing includes a plurality of metal islands engaged with a plastic member such that a plurality of projections of the plastic member interlock with a corresponding plurality of recesses formed between each of the plurality of metal islands. An exterior of the housing includes a surface of each of the plurality of metal islands and at least a portion of a surface of the plastic member. An interior of the housing includes another surface of the plastic member.

According to another embodiment, a method for manufacturing the housing includes providing a metal member and cutting a plurality of recesses in a surface of the metal member. A plastic material may be provided on the surface of the metal member such that the plastic material fills the plurality of recesses to form a plastic member with a plurality of projections in the plurality of recesses. A portion of another surface of the metal member and a surface of the plastic member may be removed to form a plurality of metal islands from the metal member. The plurality of metal islands may be separated by each of the plurality of projections of the plastic member. An exterior of the housing includes an exterior surface of the plurality of metal islands and at least a portion of the surface of the plastic member. An interior of the housing includes another surface of the plastic member.

The housing for the electronic device and the method for manufacturing the housing as discussed herein can offer improvements to existing technologies. In particular, the retention of the metal islands with the plastic member can be more secure and the housing may have improved structural integrity. The projections of the plastic member can be tapered or vertical to interlock with the corresponding plurality of recesses formed between each of the metal islands. The plastic member can include one or more protrusions for engaging with another housing of the electronic device, such as a front housing and/or display. The plastic member and the metal islands can be curved so that the housing is curved. The plastic member and the metal islands can form one or more of a honeycomb pattern, a diamond pattern, or a lattice pattern on the exterior of the housing. The plastic member can include one or more openings adapted for an electrical connection to the metal islands, and the metal islands may be used as an antenna for the electronic device. The exterior of the housing may be finished to improve the aesthetic quality of the housing. When manufacturing the housing, one or more vent openings can be formed in the metal member to allow trapped air to escape when plastic material is provided. It should be appreciated that other benefits and efficiencies are envisioned.

Figure 1:
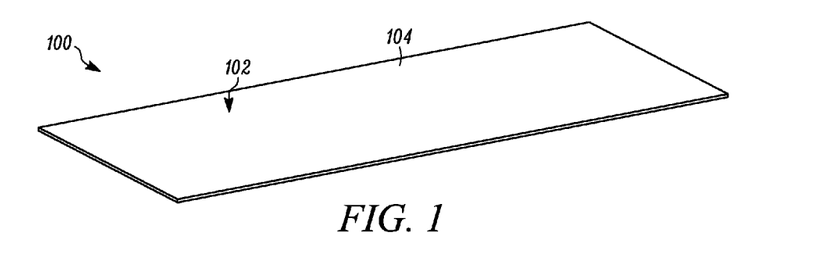
FIG. 1 is a perspective view of an interior of a finished housing for an electronic device, in accordance with some embodiments.
Figure 2:
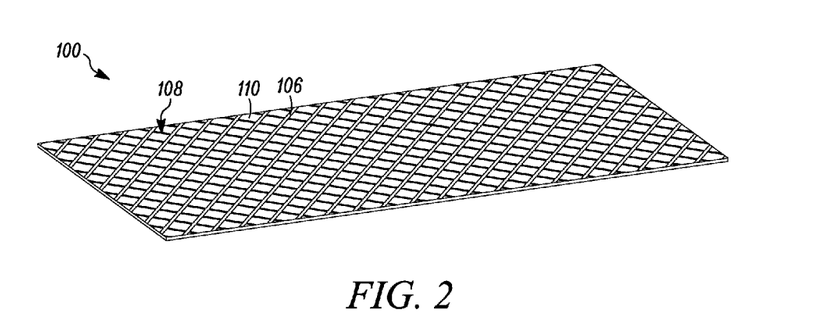
FIG. 2 is a perspective view of an exterior of a finished housing for an electronic device, in accordance with some embodiments.
Figure 3:
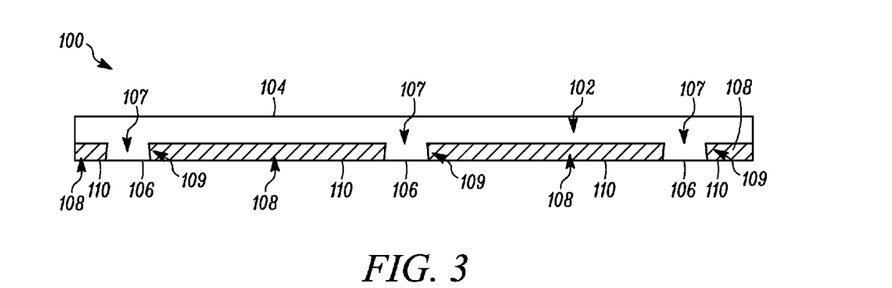
FIG. 3 is a cross section of a finished housing for an electronic device, in accordance with some embodiments.

FIGS. 1-3 illustrate views of a housing 100 for an electronic device, in accordance with some embodiments. The housing 100 is finished in FIGS. 1-3 and can be used as a rear housing for the electronic device, for example. In particular, an interior of the housing 100 is shown in a perspective view in FIG. 1. The interior of the housing 100 may face the inside of the electronic device, which can include components, such as a processor, battery, antenna, etc., for example. The interior may include an inner surface 104 of a plastic member 102. FIG. 2 illustrates a perspective view of an exterior of the housing 100 that may function as the exterior of the electronic device and be exposed to the environment. The exterior may be handled by a user of the electronic device, for example. The exterior may include an outer surface 110 of a plurality of metal islands 108 and an outer surface 106 of the plastic member 102 that is opposite of the inner surface 104 of the plastic member 102.

The configuration of the housing 100 may also be seen in the cross section of the housing 100 shown in FIG. 3. In FIG. 3, it can be seen that the housing 100 includes the plastic member 102 and the plurality of metal islands 108. In particular, projections 107 of the plastic member 102 can interlock with corresponding recesses 109 formed between each of the plurality of metal islands 108. The interlocking of the projections 107 and the recesses 109 can ensure a more secure retention of the plastic member 102 with the plurality of metal islands 108. The projections 107 and the recesses 109 are shown in FIG. 3 as tapered or dovetailed and may correspond with one another. In other embodiments, the projections 107 and recesses 109 may be vertical and correspond with one another, and/or may be shaped differently.

As seen in FIGS. 1 and 3, the plastic member 102 is the only material that faces the inside of the electronic device. The metal islands 108 cannot be in contact with any of the components of the electronic device because the plastic member 102 covers the inner surface of the metal islands 108. The exterior of the housing 100, as seen most clearly in FIG. 2, includes the metal islands 108 and the outer surface 106 of the plastic member 102. While FIG. 2 shows a diamond pattern of the metal islands 108 and the outer surface 106 of the plastic member 102, other patterns are contemplated and possible, such as, but not limited to, a honeycomb pattern or a lattice pattern, for example.

The plastic member 102 can include one or more protrusions (not shown) that can engage with another housing of the electronic device. For example, the other housing of the electronic device may be a front housing and/or display. The housing 100 and the other housing can together enclose the interior of the electronic device.

The plastic member 102 can be any appropriate plastic material, such as a thermoplastic, e.g., polycarbonate. The plastic material used for the plastic member 102 may be electrically insulating so that the components within the electronic device are isolated from the environment. The metal islands 108 of the housing 100 can be any appropriate metal material, such as aluminum, steel, copper, and/or other types of metal materials. The exterior of the housing 100, including the metal islands 108 and/or the outer surface 106 of the plastic member 102 can be finished as desired. For example, the exterior of the housing 100 may be machined, ground, polished, sandblasted, anodized, plated (e.g., to a mirror finish or a particular color), decorated, and/or coated (e.g., using physical vapor deposition (PVD)).

Figure 4:
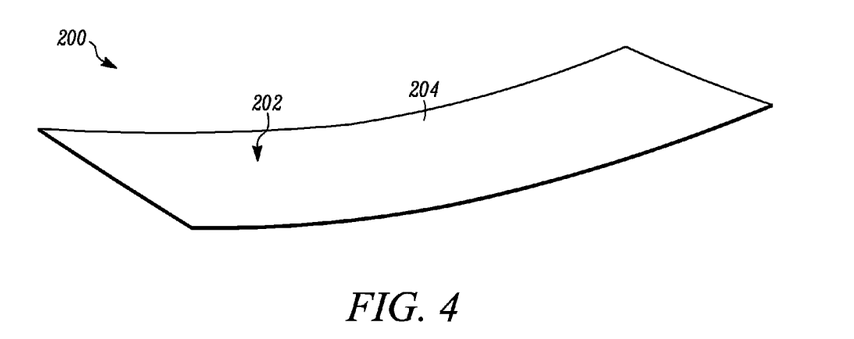
FIG. 4 is a perspective view of an interior of a finished curved housing for an electronic device, in accordance with some embodiments.
Figure 5:
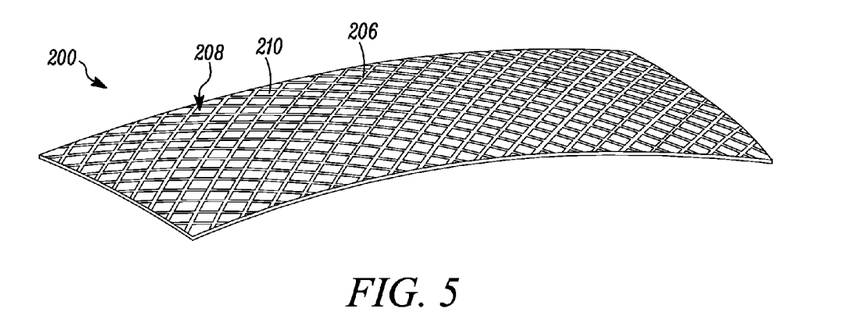
FIG. 5 is a perspective view of an exterior of a finished curved housing for an electronic device, in accordance with some embodiments.
Figure 6:
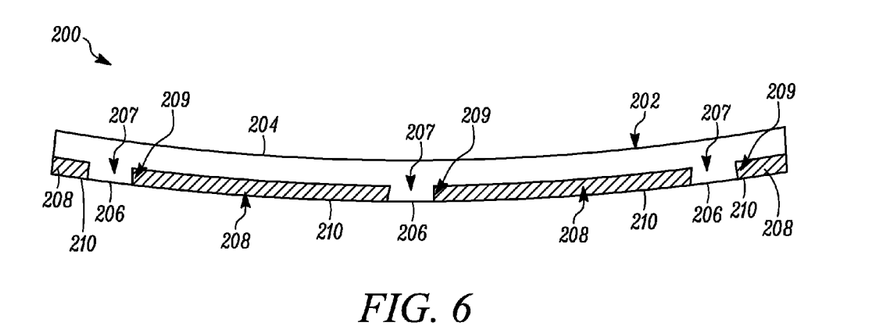
FIG. 6 is a cross section of a finished curved housing for an electronic device, in accordance with some embodiments.

FIGS. 4-6 illustrate views of a curved housing 200 for an electronic device, in accordance with some embodiments. The housing 200 is finished in FIGS. 4-6 and can be used as a rear housing for the electronic device, for example. In particular, an interior of the curved housing 200 is shown in a perspective view in FIG. 4. The interior of the curved housing 200 may face the inside of the electronic device, which can include components, such as a processor, battery, antenna, etc., for example. The interior may include an inner surface 204 of a plastic member 202. FIG. 5 illustrates a perspective view of an exterior of the curved housing 200 that may function as the exterior of the electronic device and be exposed to the environment. The exterior may be handled by a user of the electronic device. The housing 200 may be curved such that the user can more comfortably grip the electronic device and/or for aesthetic reasons, for example. The exterior may include an outer surface 210 of a plurality of metal islands 208 and an outer surface 206 of the plastic member 202 that is opposite of the inner surface 204 of the plastic member 202.

The configuration of the curved housing 200 may also be seen in the cross section of the housing 200 shown in FIG. 6. In FIG. 6, it can be seen that the housing 200 includes the plastic member 202 and the plurality of metal islands 208. In particular, projections 207 of the plastic member 202 can interlock with corresponding recesses 209 formed between each of the plurality of metal islands 208. The interlocking of the projections 207 and the recesses 209 can ensure a more secure retention of the plastic member 202 with the plurality of metal islands 208. The projections 207 and the recesses 209 are shown in FIG. 6 as tapered or dovetailed and correspond with one another. In other embodiments, the projections 207 and recesses 209 may be vertical and correspond with one another, and/or may be shaped differently.

While FIG. 5 shows a diamond pattern of the metal islands 208 and the outer surface 206 of the plastic member 202, other patterns are contemplated and possible, such as, but not limited to, a honeycomb pattern or a lattice pattern, for example. As described above with respect to the housing 100, the plastic member 202 of the curved housing 200 can include one or more protrusions (not shown) that can engage with another housing of the electronic device. Furthermore, the plastic member 202 can be any appropriate plastic material, such as a thermoplastic, e.g., polycarbonate. The plastic material used for the plastic member 202 may be electrically insulating so that the components within the electronic device are isolated from the environment. The metal islands 208 of the housing 200 can be any appropriate metal material, such as aluminum, steel, copper, and/or other types of metal materials.

Figure 7:
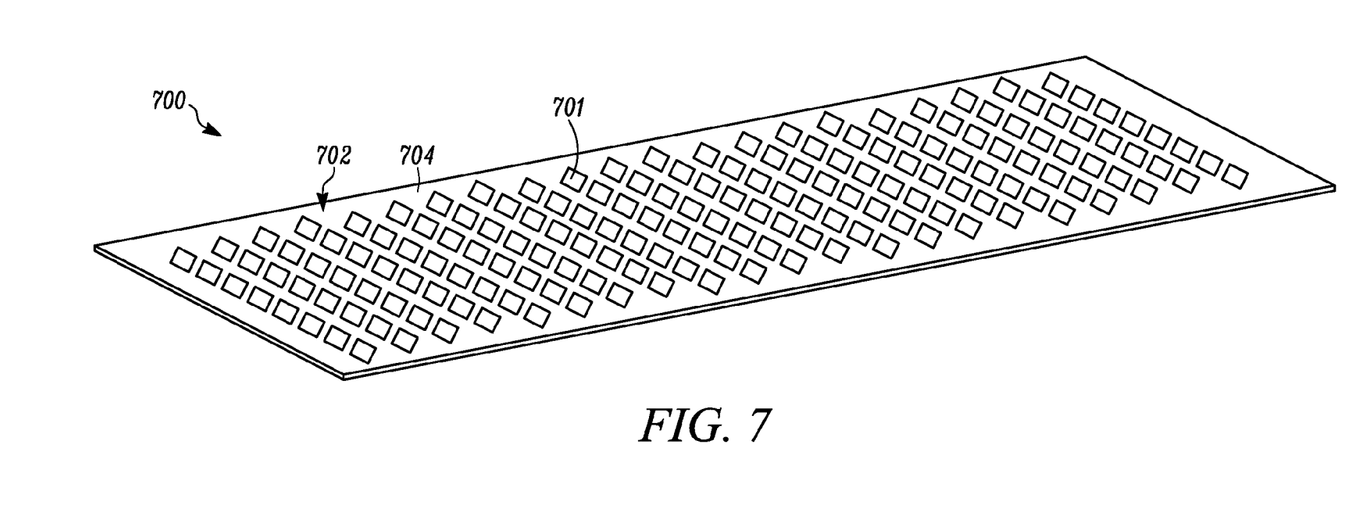
FIG. 7 is a perspective view of an interior of a finished curved housing for an electronic device, including openings for electrical connections, in accordance with some embodiments.
Figure 8:
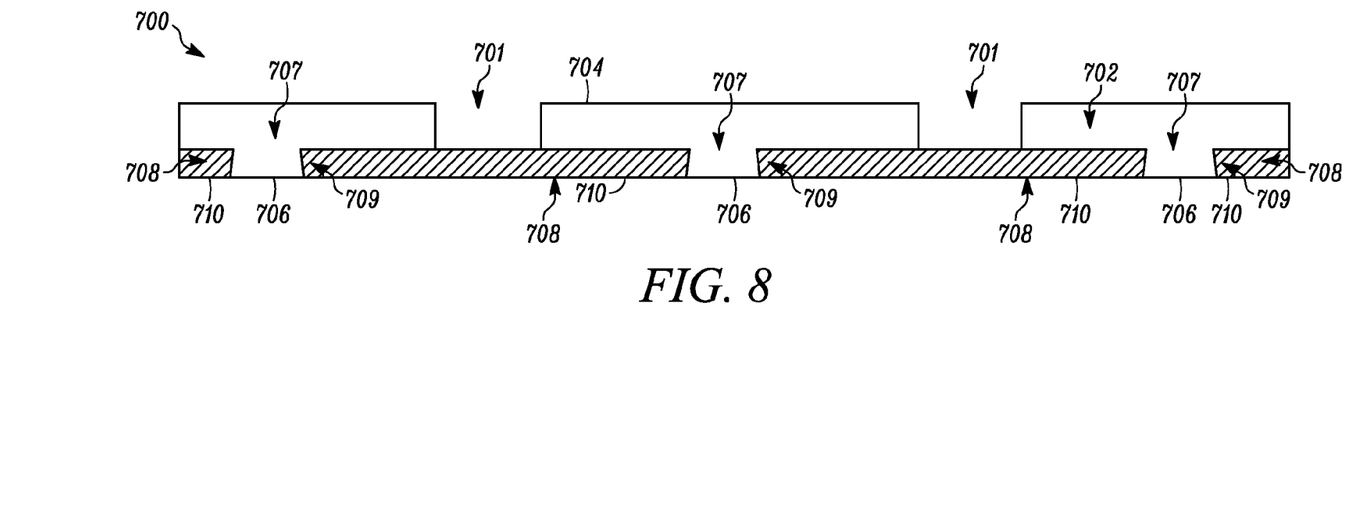
FIG. 8 is a cross section of a finished curved housing for an electronic device, including openings for electrical connections, in accordance with some embodiments.

FIGS. 7-8 illustrate views of an embodiment of a housing 700 for an electronic device. The housing 700 includes openings or vias 701 for electrical connections to metal islands 708. The housing 700 can be used as a rear housing for an electronic device, for example. An interior of the housing 700 is shown in the perspective view of FIG. 7, and a cross section of the housing 700 is shown in FIG. 8. The housing 700 is similar to the housings 100 and 200 described above, in that the housing 700 includes an interior that has an inner surface 704 of a plastic member 702. An exterior of the housing 700 may include an outer surface 710 of a plurality of metal islands 708 and an outer surface 706 of the plastic member 702 that is opposite of the inner surface 704 of the plastic member 702. Projections 707 of the plastic member 702 can interlock with corresponding recesses 709 formed between each of the plurality of metal islands 708.

Furthermore, in the embodiment shown in FIG. 7, the openings 701 may be formed in the inner surface 704 of the plastic member 702. The openings 701 may be adapted for use as an electrical connection to one or more of the metal islands 708, and may be of any appropriate shape and size. The metal islands 708 may be used as an antenna, for example, so that the metal islands 708 are electrically connected through the openings 701 to a transceiver, transmitter, receiver, and/or other components within the electronic device. In some embodiments, the metal islands 708 may be utilized as a switchable antenna to optimize transmission or receiving of radio frequency signals, for example.

Figure 9:
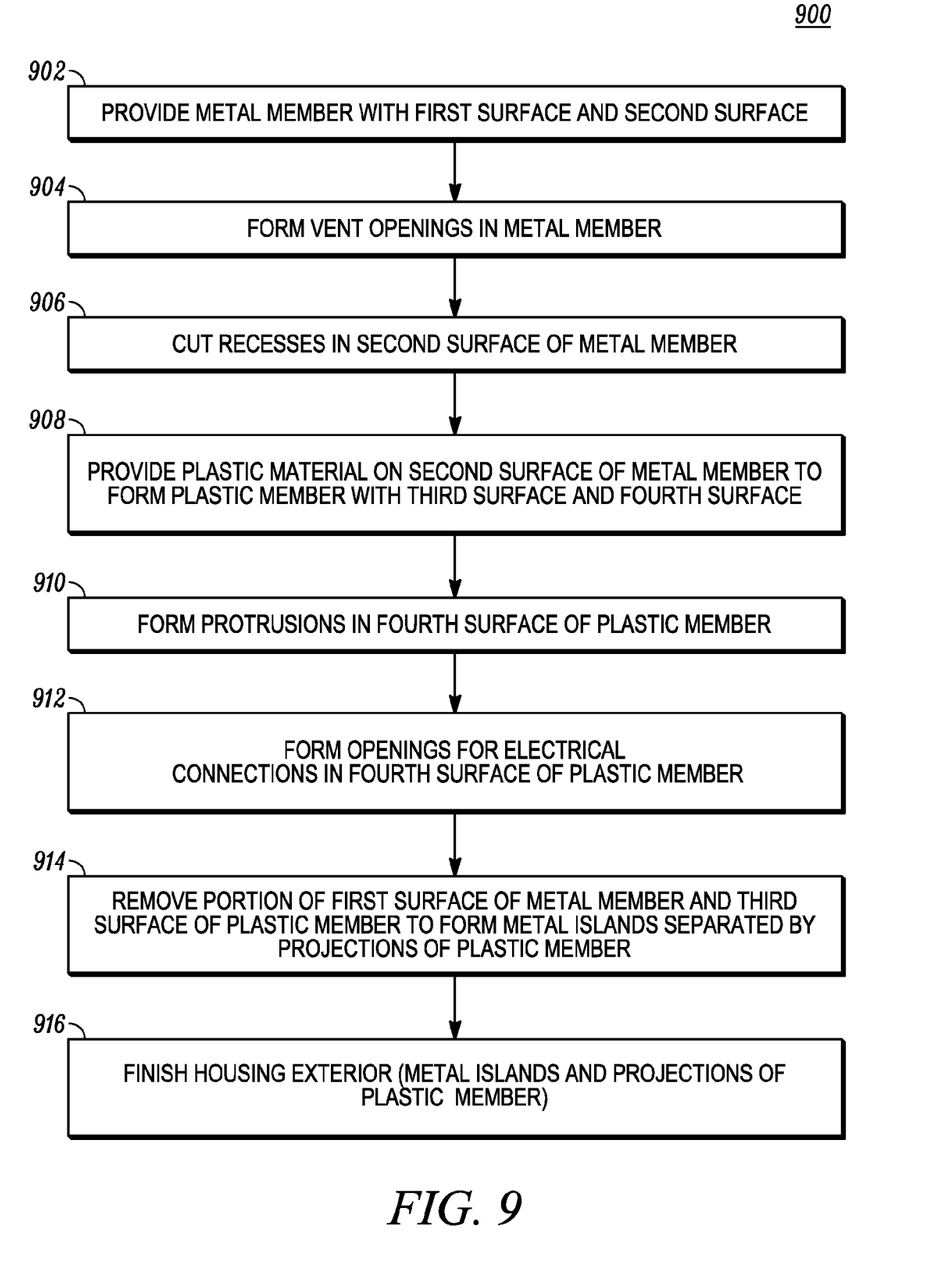
FIG. 9 is a flow diagram depicting a method for manufacturing a housing for an electronic device, in accordance with some embodiments.
Figure 10:
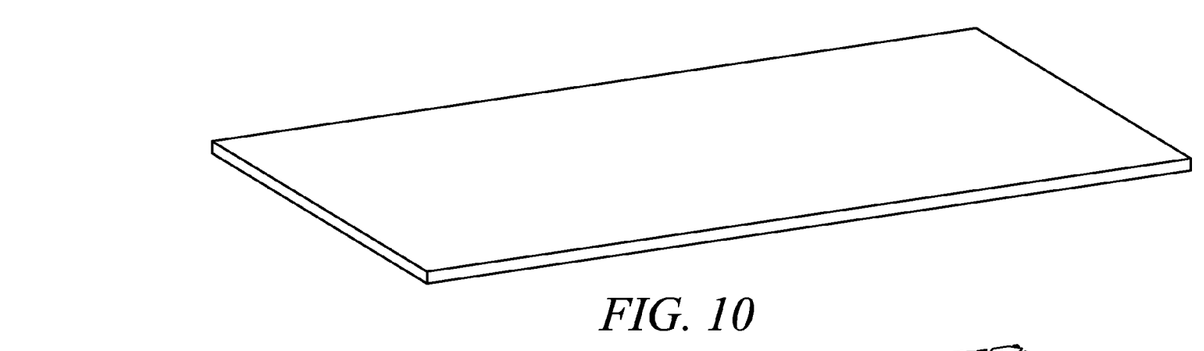
FIG. 10 is a perspective view of a metal member during a method for manufacturing a housing for an electronic device, in accordance with some embodiments.

FIG. 9 is a flowchart of a method 900 for manufacturing a housing for an electronic device, such as the housings 100, 200, and 700 described above. The method 900 can result in a housing that is a combination of a plastic material and a metal material, and in particular, metal islands interlocked with the plastic material. The method 900 begins with providing 902 a metal member that has a first exterior surface and a second interior surface opposite of the first surface, as shown in FIG. 10. The metal member can be any appropriate metal material, such as aluminum, steel, copper, and/or other types of metal materials. The metal member provided 902 may have a thickness that is greater than a thickness of the metal islands in the finished housing. The metal member may be flat or curved, for example.

Vent openings may be optionally formed 904 in the metal member for assisting the flow of plastic material, described below. The vent openings may be of any appropriate size and shape, and can be adapted to allow trapped air to escape when the plastic material is provided. The vent openings may be located where the recesses will be cut into the metal member, as described below.

Figure 11:
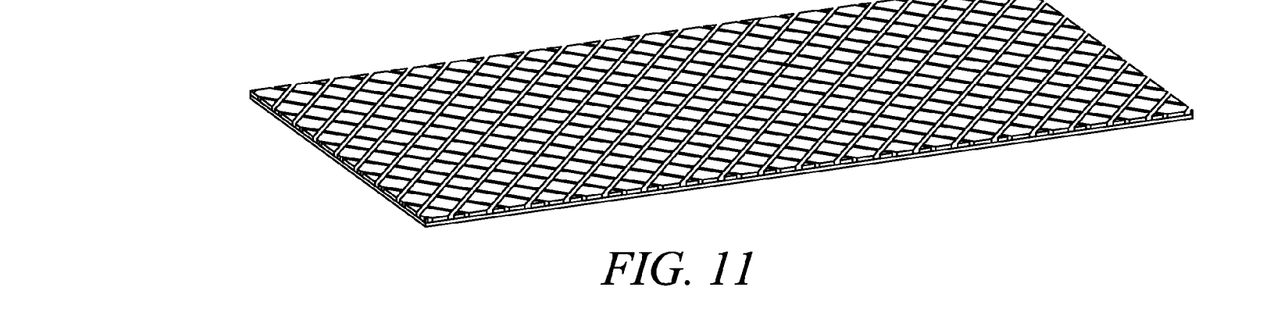
FIG. 11 is a perspective view of a metal member including recesses during a method for manufacturing a housing for an electronic device, in accordance with some embodiments.
Figure 12:
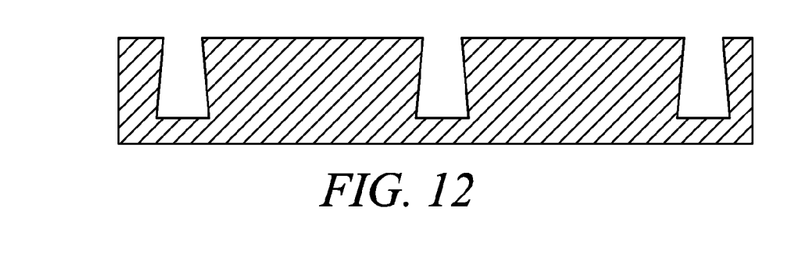
FIG. 12 is a cross section of a metal member including recesses during a method for manufacturing a housing for an electronic device, in accordance with some embodiments.

Recesses may be cut 906 in the second surface of the metal member, as shown in FIGS. 11-12. The recesses may be cut or machined such that a desired pattern for the finished housing is formed, such as a diamond pattern, honeycomb pattern, or lattice pattern. The recesses that are cut 906 may not be through the entire depth of the metal member and may be a dovetail cut, as shown in the cross section of FIG. 12, or may be a vertical cut or other shape of cut. The recesses may assist in securely locking in the metal member to the plastic material, as described below.

Figure 13:
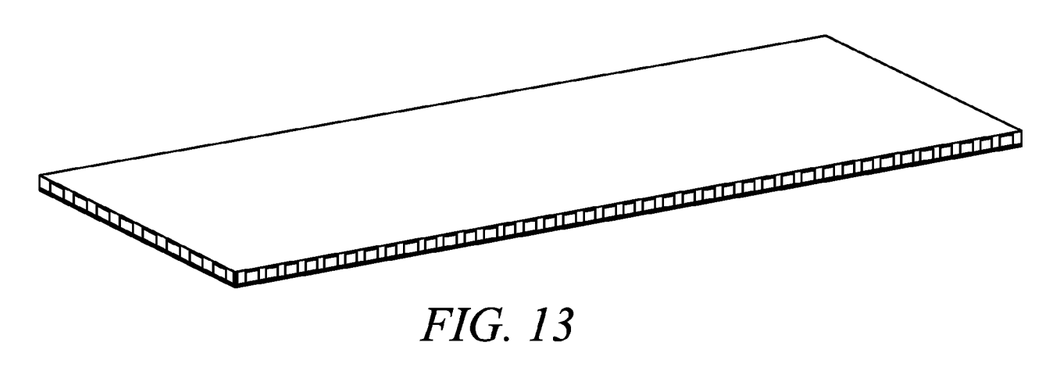
FIG. 13 is a perspective view of a metal member combined with a plastic member during a method for manufacturing a housing for an electronic device, in accordance with some embodiments.
Figure 14:
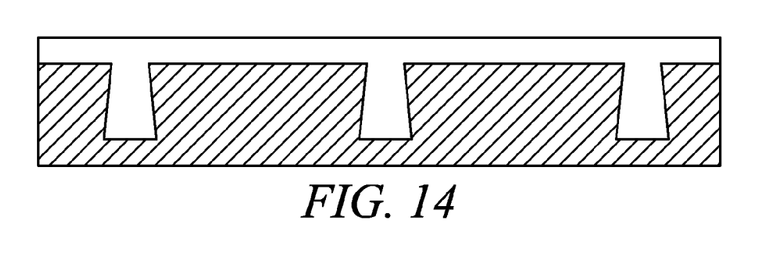
FIGS. 14 and 15 are cross sections of a metal member combined with a plastic member during a method for manufacturing a housing for an electronic device, in accordance with some embodiments.

A plastic material may be provided 908 on the second surface of the metal member, as shown in FIGS. 13-14. The plastic member can be any appropriate plastic material, such as a thermoplastic, e.g., polycarbonate. The plastic material may fill the recesses that were cut 906, so that a plastic member is formed that has a third exterior surface and a fourth interior surface opposite of the third surface. The third surface of the plastic member may be in contact with the second surface of the metal member. In addition, the third surface of the plastic member may include projections that are formed in the recesses that were cut 906 in the second surface of the metal member, as seen most clearly in FIG. 14. The fourth surface of the plastic member may function as an interior of the housing that faces the inside of the electronic device, for example. The plastic material may be injection molded and/or overmolded on the second surface of the metal member.

One or more protrusions may be optionally formed 910 on the fourth surface of the plastic member. The protrusions can engage with another housing of the electronic device. For example, the other housing of the electronic device may be a front housing and/or display. The housing and the other housing can enclose the interior of the electronic device. Openings may be optionally formed 912 in the fourth surface of the plastic member for electrical connections to metal islands that are formed later in the method 900, as described below. The openings may be of any appropriate shape and size, and can allow the metal islands to be used as antennas, for example. One or more of the metal islands could be electrically connected through the openings to a transceiver, transmitter, receiver, and/or other components within the electronic device.

Figure 15:
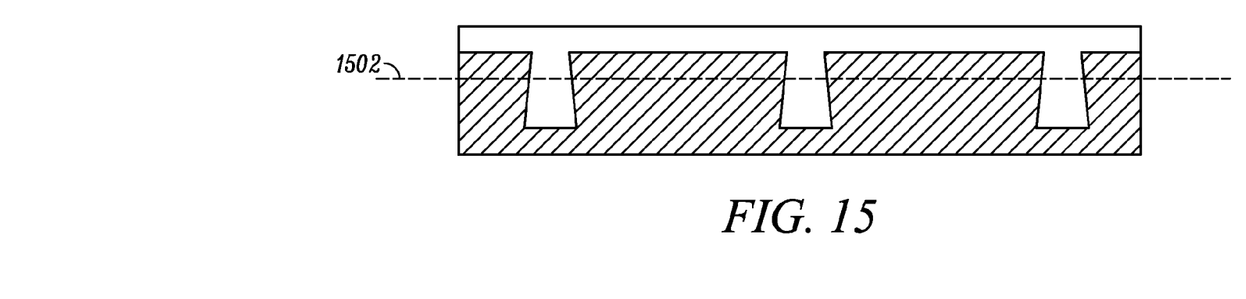

A portion of the first surface of the metal member and third surface of the plastic member may be removed 914 so that a plurality of metal islands are formed that are separated by each of the projections of the plastic member. Each of the plurality of metal islands may have an exterior surface that functions as the exterior of the housing. The portion of the first surface of the metal member and third surface of the plastic member below the line 1502 of the cross section shown in FIG. 15 may be removed 914, for example. The resulting housing may have the cross section of the housing 100 shown in FIG. 3, for example. The exterior of the housing may be finished 916, such as by machining, grinding, polishing, sandblasting, anodizing, plating (e.g., to a mirror finish or a particular color), decorating, and/or coating (e.g., using physical vapor deposition (PVD)).

Thus, it should be clear from the preceding disclosure that the housing for an electronic device and the method for manufacturing the housing may be an improvement over existing technologies. The housing and method for manufacturing the housing may advantageously ensure a more secure retention of metal islands with a plastic member, and may result in a more aesthetically pleasing housing that meets the physical and technical requirements and specifications for the electronic device.

This disclosure is intended to explain how to fashion and use various embodiments in accordance with the technology rather than to limit the true, intended, and fair scope and spirit thereof. The foregoing description is not intended to be exhaustive or to be limited to the precise forms disclosed. Modifications or variations are possible in light of the above teachings. The embodiment(s) were chosen and described to provide the best illustration of the principle of the described technology and its practical application, and to enable one of ordinary skill in the art to utilize the technology in various embodiments and with various modifications as are suited to the particular use contemplated. All such modifications and variations are within the scope of the embodiments as determined by the appended claims, as may be amended during the pendency of this application for patent, and all equivalents thereof, when interpreted in accordance with the breadth to which they are fairly, legally and equitably entitled.

The invention claimed is:

1. A housing for an electronic device, comprising:
 a plurality of metal islands, each of the plurality of metal islands having a first surface and a second surface opposite of the first surface;
 a plastic member engaged with the plurality of metal islands, the plastic member having a third surface and a fourth surface opposite of the third surface,
  the third surface of the plastic member configured to be in contact with the second surface of each of the plurality of metal islands,
  the third surface of the plastic member comprising a plurality of projections that separate each of the plurality of metal islands, the plurality of projections each having a top surface opposite the fourth surface of the plastic member, and
  the plurality of projections configured to interlock with a corresponding plurality of recesses formed between each of the plurality of metal islands;
 an exterior surface including the first surface of each of the plurality of metal islands and the top surface of each of the plurality of projections; and
 an interior surface including the fourth surface of the plastic member.

2. The housing of claim 1, wherein:
 each of the plurality of projections is tapered; and
 each of the corresponding plurality of recesses is tapered to interlock with each of the plurality of projections.

3. The housing of claim 1, wherein:
 each of the plurality of projections is vertical; and
 each of the corresponding plurality of recesses is vertical to interlock with each of the plurality of projections.

4. The housing of claim 1, wherein the fourth surface of the plastic member comprises one or more protrusions.

5. The housing of claim 4, wherein the one or more protrusions are adapted to engage with a second housing of the electronic device.

6. The housing of claim 1, wherein the plurality of metal islands and the plastic member form one or more of a honeycomb pattern, a diamond pattern, or a lattice pattern on the exterior surface of the housing.

7. The housing of claim 1, wherein the plastic member comprises one or more openings adapted for an electrical connection to one or more of the plurality of metal islands.

8. The housing of claim 7, wherein one or more of the plurality of metal islands are configured to be used as an antenna for the electronic device.

9. A method for manufacturing a housing for an electronic device, comprising:
 providing a metal member having a first surface and a second surface opposite of the first surface;
 cutting a plurality of recesses in the second surface of the metal member;
 providing a plastic material on the second surface of the metal member such that the plastic material fills the plurality of recesses to form a plastic member having a third surface and a fourth surface opposite of the third surface,
  the third surface of the plastic member configured to be in contact with the second surface of the metal member,
  the third surface of the plastic member including a plurality of projections extending into the plurality of recesses; and
 removing a portion of the first surface of the metal member and a portion of the plurality of projections of the plastic member to form a plurality of metal islands from the metal member that are separated by each of the plurality of projections, the plurality of metal islands each having an exterior surface,
  an exterior of the housing including the exterior surface of the plurality of metal islands and at least a portion of the plurality of projections of the plastic member,
  an interior of the housing including the fourth surface of the plastic member.

10. The method of claim 9, wherein:
 cutting the plurality of recesses comprises cutting a plurality of tapered recesses in the second surface of the metal member; and
 each of the plurality of projections is tapered to interlock with each of the plurality of tapered recesses.

11. The method of claim 9, wherein:
 cutting the plurality of recesses comprises cutting a plurality of vertical recesses in the second surface of the metal member; and
 each of the plurality of projections is vertical to interlock with each of the plurality of vertical recesses.

12. The method of claim 9, wherein the metal member has a first thickness and the plurality of metal islands each have a second thickness less than the first thickness.

13. The method of claim 9, wherein providing the plastic material comprises overmolding the plastic material on the second surface of the metal member.

14. The method of claim 9, wherein providing the plastic material comprises forming one or more protrusions on the fourth surface of the plastic member, wherein the one or more protrusions are adapted to engage with a second housing of the electronic device.

15. The method of claim 9, wherein providing the plastic material comprises forming one or more openings in the fourth surface of the plastic member, the one or more openings adapted for an electrical connection to one or more of the plurality of metal islands.

16. The method of claim 15, further comprising making the electrical connection to one or more of the plurality of metal islands through the one or more openings, the one or more of the plurality of metal islands configured to be used as an antenna for the electronic device.

17. The method of claim 9, further comprising finishing the exterior of the housing, subsequent to the removing of the portion of the first surface of the metal member and the portion of the plurality of projections of the plastic member.

18. The method of claim 9, wherein providing the metal member comprises forming one or more vent openings in the metal member, the one or more vent openings adapted to allow trapped air to escape when providing the plastic material.

19. The method of claim 9, wherein the plurality of metal islands and the plastic member form one or more of a honeycomb pattern, a diamond pattern, or a lattice pattern on the exterior of the housing.

20. The housing of claim 1, wherein the exterior surface of the housing is finished by one or more processes comprising at least one of machining, polishing, sandblasting, anodizing, plating, decorating, or coating.

* * * * *